United States Patent
Kato et al.

(10) Patent No.: US 9,955,573 B2
(45) Date of Patent: Apr. 24, 2018

(54) RESIN COMPOSITION, PREPREG AND LAMINATE

(75) Inventors: Yoshihiro Kato, Tokyo (JP); Takaaki Ogashiwa, Tokyo (JP); Hiroshi Takahashi, Tokyo (JP); Tetsuro Miyahira, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 38 days.

(21) Appl. No.: 13/980,686

(22) PCT Filed: Jan. 18, 2012

(86) PCT No.: PCT/JP2012/050957
§ 371 (c)(1),
(2), (4) Date: Sep. 11, 2013

(87) PCT Pub. No.: WO2012/099162
PCT Pub. Date: Jul. 26, 2012

(65) Prior Publication Data
US 2014/0017502 A1 Jan. 16, 2014

(30) Foreign Application Priority Data
Jan. 20, 2011 (JP) ................. 2011-009929

(51) Int. Cl.
*B32B 27/38* (2006.01)
*B32B 15/08* (2006.01)
*H05K 1/03* (2006.01)
*C08J 5/24* (2006.01)
*C08G 59/40* (2006.01)
*C08L 63/00* (2006.01)
*B32B 5/02* (2006.01)
*B32B 5/26* (2006.01)
*B32B 5/28* (2006.01)
*B32B 15/14* (2006.01)
*B32B 15/20* (2006.01)

(52) U.S. Cl.
CPC ........... *H05K 1/0373* (2013.01); *B32B 5/024* (2013.01); *B32B 5/26* (2013.01); *B32B 5/28* (2013.01); *B32B 15/14* (2013.01); *B32B 15/20* (2013.01); *C08G 59/40* (2013.01); *C08J 5/24* (2013.01); *C08L 63/00* (2013.01); *B32B 2250/05* (2013.01); *B32B 2260/023* (2013.01); *B32B 2260/046* (2013.01); *B32B 2262/101* (2013.01); *B32B 2307/206* (2013.01); *B32B 2307/308* (2013.01); *B32B 2307/3065* (2013.01); *B32B 2307/734* (2013.01); *B32B 2457/08* (2013.01); *C08K 3/11* (2018.01); *H05K 1/0366* (2013.01); *H05K 2201/0209* (2013.01); *Y10T 428/31529* (2015.04)

(58) Field of Classification Search
None
See application file for complete search history.

(56) References Cited

U.S. PATENT DOCUMENTS

| | | | |
|---|---|---|---|
| 6,190,787 B1 | 2/2001 | Maeda et al. | |
| 6,361,866 B1 * | 3/2002 | Ogima et al. | 428/413 |
| 2003/0050399 A1 * | 3/2003 | Kimura | C08G 59/20 525/107 |
| 2004/0166324 A1 | 8/2004 | Mishima et al. | |
| 2005/0095434 A1 * | 5/2005 | Hirota | B32B 5/26 428/414 |
| 2006/0084787 A1 * | 4/2006 | Sugano et al. | 528/422 |
| 2008/0187763 A1 | 8/2008 | Kato et al. | |
| 2009/0017316 A1 | 1/2009 | Kato et al. | |
| 2009/0069490 A1 * | 3/2009 | Ogura et al. | 524/540 |
| 2011/0244183 A1 * | 10/2011 | Goto | B32B 15/08 428/145 |
| 2013/0045650 A1 * | 2/2013 | Ogashiwa et al. | 442/59 |
| 2013/0108961 A1 * | 5/2013 | Oonishi et al. | 430/280.1 |
| 2013/0136930 A1 * | 5/2013 | Kato | H05K 1/0373 428/418 |

FOREIGN PATENT DOCUMENTS

| | | |
|---|---|---|
| JP | 2001-316564 | 11/2001 |
| JP | 2002-194119 | 7/2002 |
| JP | 2004-59643 | 2/2004 |
| JP | 2007-45984 | 2/2007 |
| JP | 2008-31344 | 2/2008 |
| JP | 2008-214602 | 9/2008 |
| JP | 2009-24056 | 2/2009 |
| JP | 2009-35728 | 2/2009 |
| JP | 2009-074036 | 4/2009 |
| JP | 2009-120702 | 6/2009 |
| JP | 2009-279770 | 12/2009 |
| JP | 2010-248473 | 11/2010 |
| WO | WO 2011-108524 | * 9/2011 |

OTHER PUBLICATIONS

International Search Report dated Apr. 3, 2012 in PCT/JP2012/050957.

* cited by examiner

*Primary Examiner* — Coris Fung
(74) *Attorney, Agent, or Firm* — Greenblum & Bernstein, P.L.C.

(57) ABSTRACT

It is an object to provide a prepreg for a printed laminate that has a low thermal expansion coefficient in the planar direction, excellent drillability, and further excellent heat resistance and flame retardancy, and a laminate and a metal foil-clad laminate. A resin composition according to the present invention includes a molybdenum compound (A); an epoxy resin (B); a curing agent (C); and an inorganic filler (D), wherein a Mohs hardness of the inorganic filler (D) is 3.5 or more, and a content of the inorganic filler (D) is 40 to 600 parts by mass based on 100 parts by mass of a total of resin solid components.

12 Claims, No Drawings

RESIN COMPOSITION, PREPREG AND LAMINATE

TECHNICAL FIELD

The present invention relates to a resin composition and more particularly to a resin composition used in a prepreg for a printed wiring board. Further, the present invention relates to a prepreg for a printed wiring board fabricated using the resin composition, and a laminate and a metal foil-clad laminate using the prepreg.

BACKGROUND ART

In recent years, higher integration, higher functionality, and higher density mounting of semiconductors widely used in electronic equipment, communication instruments, personal computers, and the like have been increasingly accelerated, and the demand for the thermal expansion coefficient, drillability, heat resistance, and flame retardancy of laminates for semiconductor plastic packages has increased more than ever before.

Particularly, in recent years, a reduction in the thermal expansion coefficient of the laminate in the planar direction has been strongly required. This is because the difference in thermal expansion coefficient between a semiconductor device and a printed wiring board for a semiconductor plastic package is large, and when a thermal shock is applied, warpage occurs in the semiconductor plastic package due to the difference in thermal expansion coefficient, and poor connection occurs between the semiconductor device and the printed wiring board for a semiconductor plastic package, and between the semiconductor plastic package and the mounted printed wiring board.

In order to decrease the thermal expansion coefficient while satisfying heat resistance and flame retardancy, there is a method of increasing the amount of an inorganic filler filled in a resin composition (for example, see Patent Literatures 1 and 2). However, problems of this method are that the cured product is hard and brittle, the drill bit wears quickly, and the frequency of the replacement of the drill bit increases due to the breakage of the drill bit or a lowering in accuracy of hole position.

As another method, there is a method of filling an inorganic filler having high Mohs hardness. For example, methods of blending boehmite or silica as an inorganic filler are known. Although these methods are effective in decreasing the thermal expansion coefficient, a disadvantage of these methods is that because of the hard inorganic filler, the wear of the drill is severe, and the drillability worsens.

On the other hand, when magnesium hydroxide or aluminum hydroxide is blended as an inorganic filler having lower Mohs hardness than boehmite and silica (for example, see Patent Literatures 3 and 4), the drillability is better than in a case where boehmite or silica is used alone, but the thermal expansion coefficient in the planar direction obtained with this is not satisfactory, and the heat resistance decreases under the influence of crystal water released during heating.

CITATION LIST

Patent Literature

Patent Literature 1: Japanese Patent Laid-Open No. 2004-059643

Patent Literature 2: Japanese Patent Laid-Open No. 2009-120702

Patent Literature 3: Japanese Patent Laid-Open No. 2009-074036

Patent Literature 4: Japanese Patent Laid-Open No. 2009-279770

SUMMARY OF INVENTION

Technical Problem

It is an object of the present invention to provide a resin composition used in a prepreg for a printed wiring board that has a low thermal expansion coefficient in the planar direction, excellent drillability, and further excellent heat resistance and flame retardancy, a prepreg for a printed wiring board fabricated using the resin composition, and a laminate and a metal foil-clad laminate using the prepreg.

Solution to Problem

The inventors have found that a laminate that satisfies all of the above objects can be obtained by using a resin composition comprising a molybdenum compound (A); an epoxy resin (B); a curing agent (C); and an inorganic filler (D), wherein a Mohs hardness of the inorganic filler is 3.5 or more, and a content of the inorganic filler is 40 to 600 parts by mass based on 100 parts by mass of a total of resin solid components.

Specifically, one aspect of the present invention provides a resin composition comprising:
a molybdenum compound (A);
an epoxy resin (B);
a curing agent (C); and
an inorganic filler (D), wherein
a Mohs hardness of the inorganic filler (D) is 3.5 or more, and a content of the inorganic filler (D) is 40 to 600 parts by mass based on 100 parts by mass of a total of resin solid components.

Another aspect of the present invention provides a prepreg obtained by impregnating or coating a substrate with the above resin composition.

Another aspect of the present invention provides a laminate obtained by laminating and molding the above prepreg.

Another aspect of the present invention provides a metal foil-clad laminate obtained by laminating and molding the above prepreg and a metal foil.

Advantageous Effects of Invention

The laminate obtained from the prepreg fabricated using the resin composition according to the present invention has a low thermal expansion coefficient in the planar direction, excellent drillability, and high heat resistance and flame retardancy, and therefore, a material for a semiconductor package for which various properties are required is provided.

DESCRIPTION OF EMBODIMENTS

Resin Composition

A resin composition according to the present invention comprises a molybdenum compound (A); an epoxy resin (B); a curing agent (C); and an inorganic filler (D), wherein the Mohs hardness of the inorganic filler (D) is 3.5 or more, and the content of the inorganic filler (D) is 40 to 600 parts by mass based on 100 parts by mass of the total of resin solid components. Here, the resin solid components refer to the epoxy resin (B) and the curing agent (C), also including a maleimide compound and/or a BT resin when they are contained in the resin composition. The resin composition according to the present invention is preferably used for the fabrication of a prepreg for a printed wiring board. Each component constituting the resin composition will be described below.

Molybdenum Compound (A)

Examples of the molybdenum compound (A) used in the present invention include molybdenum compounds, such as molybdic acid, zinc molybdate, ammonium molybdate, sodium molybdate, calcium molybdate, potassium molybdate, and molybdenum trioxide. By blending the molybdenum compound (A), the flame retardancy of a laminate obtained from a prepreg fabricated using the resin composition according to the present invention is improved.

The form of the molybdenum compound (A) in the present invention when it is blended is not particularly limited, and the molybdenum compound (A) is preferably used alone (unsupported form) rather than as a form in which a core material of an inorganic filler is coated with the molybdenum compound. By not using an inorganic filler having a Mohs hardness of less than 3.5 conventionally used as a core material, the heat resistance of a laminate obtained from a prepreg fabricated using the resin composition according to the present invention is improved. Therefore, the content of an inorganic filler having a Mohs hardness of less than 3.5 contained in the resin composition according to the present invention is preferably 100 parts by mass or less based on 100 parts by mass of the molybdenum compound (A). Further, the resin composition according to the present invention more preferably comprises substantially no inorganic filler having a Mohs hardness of less than 3.5. Examples of the inorganic filler having a Mohs hardness of less than 3.5 include talc (Mohs hardness 1), gypsum (Mohs hardness 2), magnesium hydroxide (Mohs hardness 2.5), calcite (Mohs hardness 3), and aluminum hydroxide (Mohs hardness 3).

The amount of the molybdenum compound (A) blended in the present invention is preferably about 0.2 to 30 parts by mass based on 100 parts by mass of the total of the resin solid components in terms of flame retardancy and heat resistance. Particularly, the molybdenum compound (A) is preferably used in the range of 1 to 10 parts by mass based on 100 parts by mass of the total of the resin solid components.

Epoxy Resin (B)

The epoxy resin (B) used in the present invention is preferably a non-halogen-based epoxy resin because of an increased interest in environmental problems in recent years. Examples thereof include bisphenol A-based epoxy resins, bisphenol F-based epoxy resins, phenol novolac-based epoxy resins, cresol novolac-based epoxy resins, bisphenol A novolac-based epoxy resins, trifunctional phenol-based epoxy resins, tetrafunctional phenol-based epoxy resins, naphthalene-based epoxy resins, biphenyl-based epoxy resins, aralkyl novolac-based epoxy resins, alicyclic epoxy resins, polyol-based epoxy resins, glycidyl amines, glycidyl esters, compounds obtained by epoxidizing the double bond of butadiene or the like, and compounds obtained by the reaction of hydroxyl group-containing silicone resins with epichlorohydrin. Among them, at least one of aralkyl novolac-based epoxy resins and phenol novolac-based epoxy resins is preferred in terms of improving the flame retardancy and heat resistance of the obtained laminate, and aralkyl novolac-based epoxy resins represented by the following formula (1) are more preferred in terms of further improving flame retardancy. Specifically, phenol biphenyl aralkyl-based epoxy resins, polyoxynaphthylene-based epoxy resins, and the like are preferably used. Particularly, phenol phenyl aralkyl-based epoxy resins represented by the following formula (2) are preferred. In addition, in terms of a thermal expansion coefficient, epoxy resins having a naphthalene skeleton represented by the following formula (3) are preferably used. Among them, particularly a case where the structure of the following formula (3) is represented by the following formula (6) or the following formula (7) is preferred. Examples of products of the epoxy resins represented by the following formula (3) include EXA-7311 manufactured by DIC Corporation. One of these epoxy resins can be used or two or more of these epoxy resins can be used in appropriate combination according to the purpose.

[Formula 1]

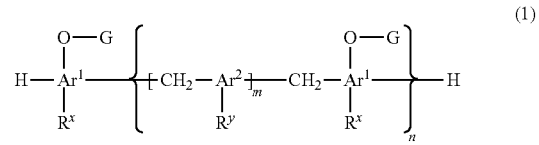

(1)

wherein $Ar^1$ and $Ar^2$ each identically or differently represent an aryl group in which a monocyclic or polycyclic aromatic hydrocarbon, such as a phenyl group, a naphthyl group, or a biphenyl group, is a substituent, and $R^x$ and $R^y$ each identically or differently represent a hydrogen atom, an alkyl group, or an aryl group; m represents an integer of 1 to 5, and n represents an integer of 1 to 50; and G represents a glycidyl group.

[Formula 2]

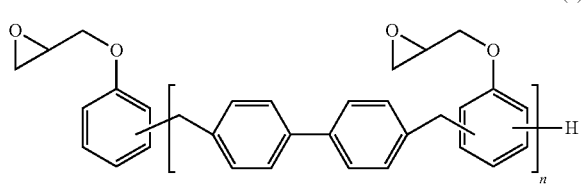

(2)

wherein n represents an integer of 1 or more.

[Formula 3]

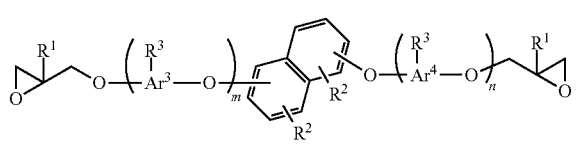

(3)

wherein $R^1$ represents a hydrogen atom or a methyl group, $Ar^3$ and $Ar^4$ are each identically or differently a naphthylene group or a phenylene group, and both groups may each have an alkyl group having 1 to 4 carbon atoms or a phenylene group as a substituent; $R^2$ each independently represents a hydrogen atom, an alkyl group having 1 to 4 carbon atoms, or an aralkyl group represented by the following formula (4), m and n are each an integer of 0 to 4, either one of m or n is 1 or more, and $R^3$ represents a hydrogen atom, an aralkyl group represented by the following general formula (4), or an epoxy group-containing aromatic hydrocarbon group represented by the following general formula (5); and in the above general formula (3), the bonding position to a naphthalene structure site may be either of two benzene rings constituting the naphthalene structure site.

[Formula 4]

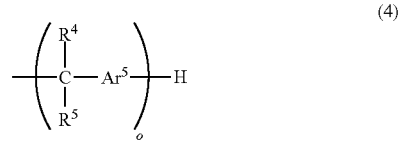

(4)

wherein $R^4$ and $R^5$ each independently represent a hydrogen atom or a methyl group, and $Ar^5$ represents a phenylene group, a phenylene group in which 1 to 3 hydrogen atoms are each nucleus-replaced by an alkyl group having 1 to 4 carbon atoms, a naphthylene group, or a naphthylene group in which 1 to 3 hydrogen atoms are each nucleus-replaced by an alkyl group having 1 to 4 carbon atoms; and o is 0.1 to 4 on average.

[Formula 5]

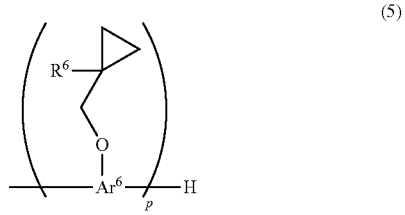

(5)

wherein $R^6$ represents a hydrogen atom or a methyl group, $Ar^6$ each independently represents a naphthylene group or a naphthylene group having an alkyl group having 1 to 4 carbon atoms, an aralkyl group, or a phenylene group as a substituent, and p is an integer of 1 or 2.

[Formula 6]

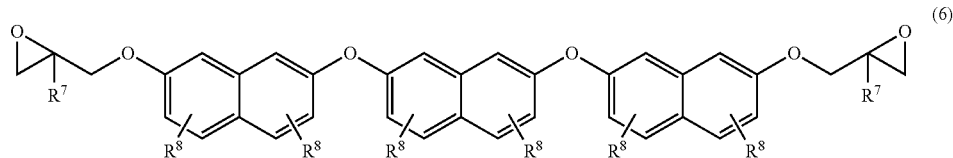

(6)

wherein $R^7$ represents a hydrogen atom or a methyl group, and $R^8$ each independently represents a hydrogen atom, an alkyl group having 1 to 4 carbon atoms, or an aralkyl group represented by the above formula (4).

[Formula 7]

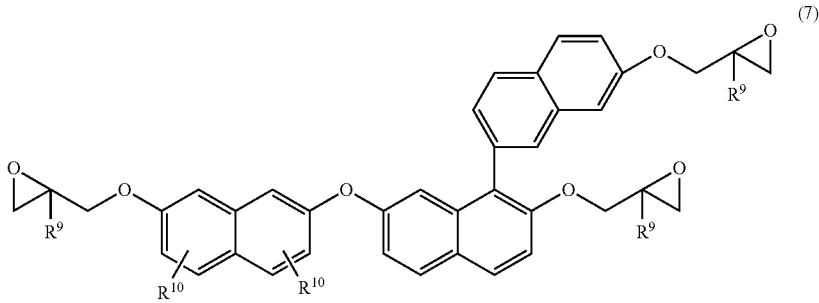

(7)

wherein R⁹ represents a hydrogen atom or a methyl group, and R¹⁰ each independently represents a hydrogen atom, an alkyl group having 1 to 4 carbon atoms, or an aralkyl group represented by the above formula (4).

The amount of the epoxy resin (B) blended is preferably about 5 to 60 parts by mass based on 100 parts by mass of the total of the resin solid components, and particularly, the epoxy resin (B) is preferably used in the range of 10 to 40 parts by mass because the intended cured product is obtained with 5 parts by mass or more, and good heat resistance can be obtained with 60 parts by mass or less.

Curing Agent (C)

The curing agent (C) used in the present invention is not particularly limited as long as it is a curing agent that cures a general epoxy resin. Cyanate ester compounds having excellent heat resistance and excellent electrical properties, particularly dielectric constant, dielectric loss tangent, and the like, or phenolic resins having excellent low water absorbency and high heat resistance are preferably used.

As the above cyanate ester compounds, generally known cyanate ester compounds can be used. Examples thereof include naphthol aralkyl-based cyanate compounds represented by the following formula (8), 1,3-dicyanatobenzene, 1,4-dicyanatobenzene, 1,3,5-tricyanatobenzene, bis(3,5-dimethyl 4-cyanatophenyl)methane, 1,3-dicyanatonaphthalene, 1,4-dicyanatonaphthalene, 1,6-dicyanatonaphthalene, 1,8-dicyanatonaphthalene, 2,6-dicyanatonaphthalene, 2,7-dicyanatonaphthalene, 1,3,6-tricyanatonaphthalene, 4,4'-dicyanatobiphenyl, bis(4-cyanatophenyl)methane, 2,2'-bis(4-cyanatophenyl)propane, bis(4-cyanatophenyl)ether, bis(4-cyanatophenyl)thioether, bis(4-cyanatophenyl)sulfone, 2,2'-bis(4-cyanatophenyl)propane, bis(3,5-dimethyl, 4-cyanatophenyl)methane, and phenol novolac-based cyanate ester compounds. Among these, naphthol aralkyl-based cyanate ester compounds represented by the following formula (8) can be particularly preferably used in terms of increasing flame retardancy.

[Formula 8]

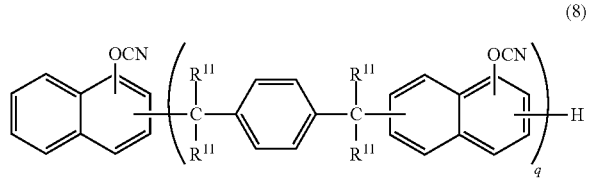

(8)

wherein R¹¹ represents a hydrogen atom or a methyl group, and q represents an integer of 1 or more.

The above phenolic resins are not particularly limited as long as they are resins having two or more phenolic hydroxyl groups in one molecule. Examples thereof include naphthol aralkyl-based phenolic resins represented by the following formula (9), phenol novolac resins, alkylphenol novolac resins, bisphenol A novolac resins, dicyclopentadiene-based phenolic resins, Xylok-based phenolic resins, terpene-modified phenolic resins, polyvinyl phenols, naphthol aralkyl-based phenolic resins, biphenyl aralkyl-based phenolic resins, naphthalene-based phenolic resins, and aminotriazine novolac-based phenolic resins. These can be used alone, or two or more of these can be used in combination. Among these, naphthol aralkyl-based phenolic resins represented by the following formula (9) can be preferably used in terms of water absorbency and heat resistance.

[Formula 9]

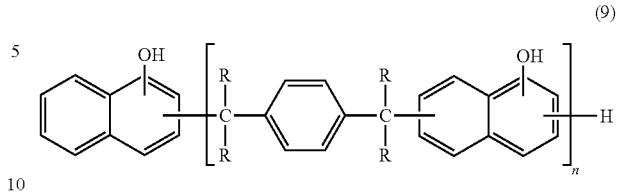

(9)

wherein R represents a hydrogen atom or a methyl group, and n represents an integer of 1 or more.

When the phenolic resin is blended, it is preferably blended so that the number ratio of the number of hydroxyl groups in the phenolic resin to the number of glycidyl groups in the epoxy resin is in the range of 0.7 to 2.5. The number ratio of the number of hydroxyl groups in the phenolic resin to the number of glycidyl groups in the epoxy resin is preferably 0.7 or more in terms of preventing a decrease in glass transition temperature, and is preferably 2.5 or less in terms of preventing a decrease in flame retardancy.

The amount of the curing agent (C) blended is not particularly limited, and is preferably 5 to 90 parts by mass, more preferably 10 to 60 parts by mass, based on 100 parts by mass of the total of the resin solid components in terms of heat resistance.

Inorganic Filler (D)

The inorganic filler (D) in the present invention is not particularly limited as long as it is one having a Mohs hardness of 3.5 or more, which is highly effective in decreasing the thermal expansion coefficient of the obtained laminate, and it is an inorganic filler usually used in a resin composition for a printed wiring board. Examples thereof include boehmite (Mohs hardness 3.5), calcium carbonate (Mohs hardness 3.5), magnesium carbonate (Mohs hardness 6), aluminum nitride (Mohs hardness 7), silica (Mohs hardness 7), burnt talc (Mohs hardness 7.5), and alumina (Mohs hardness 9). The Mohs hardness is measured by sequentially scratching a surface of a sample with 10 standard minerals for mineral hardness comparison. The number is the hardness number of each substance. The larger the value is, the harder the substance is.

The average particle diameter (D50) of the inorganic filler (D) is not particularly limited, and the average particle diameter (D50) is preferably 0.2 to 5 μm considering dispersibility. Here, D50 is a median diameter, a diameter in which the number of particles on the larger side and the number of particles on the smaller side when the measured particle size distribution of a powder is divided into two are equivalent. D50 is generally measured by a wet laser diffraction-scattering method.

The amount of the inorganic filler (D) blended is preferably about 40 to 600 parts by mass based on 100 parts by mass of the total amount of the resin solid components in terms of a thermal expansion coefficient and moldability, and further preferably in the range of 80 to 150 parts by mass. One of these inorganic fillers (D) can be used, or two or more of these inorganic fillers (D) can be appropriately mixed and used. In addition, the molybdenum compound (A) is not included in the inorganic filler (D).

Other Components

Regarding the inorganic filler (D), silane coupling agents or wetting and dispersing agents can also be used in combination. By blending silane coupling agents or wetting and dispersing agents, the dispersibility of the inorganic filler can be improved. These silane coupling agents are not particularly limited as long as they are silane coupling agents generally used for the surface treatment of inorganic substances. Specific examples thereof include aminosilane-based silane coupling agents, such as γ-aminopropyltriethoxysilane and N-β-(aminoethyl)-γ-aminopropyltrimethoxysilane, epoxysilane-based silane coupling agents, such as γ-glycidoxypropyltrimethoxysilane, vinylsilane-based silane coupling agents, such as γ-methacryloxypropyltrimethoxysilane, cationic silane-based silane coupling agents, such as N-β-(N-vinylbenzylaminoethyl)-γ-aminopropyltrimethoxysilane hydrochloride, and phenylsilane-based silane coupling agents. One of these can be used, or two or more of these can be used in appropriate combination. In addition, the wetting and dispersing agents are not particularly limited as long as they are dispersion stabilizers used for paints. Examples thereof include wetting and dispersing agents such as Disperbyk-110, Disperbyk-111, Disperbyk-180, Disperbyk 161, BYK-W996, W9010, and W903 manufactured by BYK Japan KK.

The resin composition according to the present invention may further comprise a BT resin (bismaleimide-triazine resin). The BT resin is not particularly limited as long as it is one obtained by prepolymerization using a maleimide compound and a cyanate ester compound as main components. Examples thereof include one obtained by heating and melting 2,2-bis(4-cyanatophenyl)propane (CX, manufactured by Mitsubishi Gas Chemical Company, Inc.) and bis(3-ethyl-5-methyl-4-maleimidediphenyl)methane (BMI-70: manufactured by K.I Chemical Industry Co., Ltd.), and subjecting the melt to polymerization reaction, and one obtained by heating and melting a novolac-based cyanate ester resin (Primaset PT-30, manufactured by Lonza Japan Ltd., cyanate equivalent: 124 g/eq.) and bis(3-ethyl-5-methyl-4-maleimidediphenyl)methane (BMI-70: manufactured by K.I Chemical Industry Co., Ltd.), prepolymerizing the melt, and then dissolving the prepolymer in methyl ethyl ketone.

Among these, BT resins comprising naphthol aralkyl-based cyanate ester compounds can be preferably used because since the resin skeleton is a rigid structure, heat resistance can be maintained, and reaction-inhibiting factors are decreased to increase curability, and the BT resins have excellent water absorbency and heat resistance. One cyanate ester compound, a raw material of a BT resin, can be used, or two or more cyanate ester compounds can be appropriately mixed and used.

The resin composition according to the present invention may further comprise a maleimide compound. The maleimide compound is effective in improving heat resistance. The maleimide compound used in the present invention is not particularly limited as long as it is a compound having one or more maleimide group in one molecule. Specific examples thereof include N-phenylmaleimide, N-hydroxyphenylmaleimide, bis(4-maleimidephenyl)methane, 2,2-bis{4-(4-maleimidephenoxy)-phenyl}propane, bis(3,5-dimethyl-4-maleimidephenyl)methane, bis(3-ethyl-5-methyl-4-maleimidephenyl)methane, bis(3,5-diethyl-4-maleimidephenyl)methane, polyphenylmethane maleimide, prepolymers of these maleimide compounds, or prepolymers of maleimide compounds and amine compounds. One of these can be used, or two or more of these can be appropriately mixed and used. More preferred examples include bis(4-maleimidephenyl)methane, 2,2-bis{4-(4-maleimidephenoxy)-phenyl}propane, bis(3-ethyl-5-methyl-4-maleimidephenyl)methane.

The amount of the maleimide compound used is preferably about 3 to 50 parts by mass based on 100 parts by mass of the total of the resin solid components. Further, when the amount of the maleimide compound used is in the range of 5 to 30 parts by mass, high heat resistance is obtained, and low water absorbency is provided.

The resin composition according to the present invention may further comprise a silicone powder. The silicone powder acts as a flame-retardant aid that delays burning time and increases a flame-retardant effect. In addition, the silicone powder is also effective in increasing drillability. Examples of the silicone powder can include a fine powder of polymethylsilsesquioxane in which siloxane bonds are crosslinked in the form of a three-dimensional network; a fine powder of an addition polymer of vinyl group-containing dimethylpolysiloxane and methylhydrogenpolysiloxane; a fine powder of an addition polymer of vinyl group-containing dimethylpolysiloxane and methylhydrogenpolysiloxane, whose surface is coated with polymethylsilsesquioxane in which siloxane bonds are crosslinked in the form of a three-dimensional network; and a silicone powder which polymethylsilsesquioxane in which siloxane bonds are crosslinked in the form of a three-dimensional network is coated on a surface of an inorganic support. The average particle diameter (D50) of the silicone powder is not particularly limited, and the average particle diameter (D50) is preferably 1 to 15 μm considering dispersibility.

The amount of the silicone powder blended is not particularly limited, and is preferably 1 part by mass or more and 30 parts by mass or less, particularly preferably 2 parts by mass or more and 20 parts by mass or less, based on 100 parts by mass of the total amount of the resin solid components blended. The amount of the silicone powder blended is preferably 1 part by mass or more in terms of improving drillability, and is preferably 30 parts by mass or less in terms of preventing a decrease in moldability and dispersibility.

In the resin composition according to the present invention, curing accelerators can also be used in combination as needed in order to appropriately adjust curing speed. These are not particularly limited as long as they are those generally used as curing accelerators for epoxy resins, cyanate ester compounds, or phenolic resins. Specific examples thereof include organometallic salts of copper, zinc, cobalt, nickel, and the like, imidazoles and derivatives thereof, and tertiary amines. One of these can be used, or two or more of these can be used in appropriate combination.

In the resin composition according to the present invention, various polymer compounds, such as other thermosetting resins, thermoplastic resins, and oligomers thereof, and elastomers, other flame-retardant compounds, additives, and the like can also be used in combination in a range in which the desired properties are not impaired. These are not particularly limited as long as they are those generally used. Examples of the flame-retardant compounds include nitrogen-containing compounds, such as melamine and benzoguanamine, and oxazine ring-containing compounds. As the additives, an ultraviolet absorbing agent, an antioxidant, a photopolymerization initiator, a fluorescent brightening agent, a photosensitizer, a dye, a pigment, a thickening agent, a lubricant, a defoaming agent, a dispersing agent, a leveling agent, a brightening agent, a polymerization inhibitor, and the like can also be used in appropriate combination as desired.

The method for manufacturing the resin composition according to the present invention is not particularly limited as long as the resin composition is obtained by combining the molybdenum compound (A), the epoxy resin (B), the curing agent (C), and the inorganic filler (D). Examples of the method include a method of blending the molybdenum compound (A) and the inorganic filler (D) in the epoxy resin (B), dispersing them by a homomixer or the like, and blending the curing agent (C) therein. Further, it is desired to add an organic solvent in order to decrease viscosity to improve handling properties and increase impregnation properties for glass cloth.

Prepreg

A prepreg according to the present invention is obtained by impregnating or coating a substrate with the above resin composition. For the substrate used when the prepreg according to the present invention is manufactured, known ones used for various printed wiring board materials can be used. Examples thereof include glass fibers, such as E-glass, D-glass, S-glass, NE-glass, T-glass, Q-glass, and spherical glass, inorganic fibers other than glass, or organic fibers, such as polyimides, polyamides, and polyesters. A substrate can be appropriately selected according to the intended use and performance. Examples of the shape include woven fabrics, nonwoven fabrics, rovings, chopped strand mats, and surfacing mats. The thickness is not particularly limited, and a thickness of about 0.01 to 0.3 mm is usually used. Among these substrates, particularly, glass fibers of E-glass are preferably used because of the balance between the expansion coefficient in the planar direction and drillability.

The method for manufacturing the prepreg according to the present invention is not particularly limited as long as a prepreg in which the resin composition comprising the molybdenum compound (A), the epoxy resin (B), the curing agent (C), and the inorganic filler (D), and a substrate are combined is obtained. Examples of the method include a method of impregnating or coating a substrate with a resin varnish composed of the above resin composition and an organic solvent, and then semi-curing the resin varnish by a method of heating in a dryer at 100 to 200° C. for 1 to 60 minutes, or the like to manufacture a prepreg. The amount of the resin composition adhered to the substrate is preferably in the range of 20 to 90% by weight in terms of the amount of the resin (including the inorganic filler) in the prepreg.

The organic solvent is used in order to decrease viscosity to improve handling properties and increase impregnation properties for glass cloth. The organic solvent is not particularly limited as long as it is one in which the epoxy resin (B) and the curing agent (C) are dissolved. Specific examples thereof include ketones, such as acetone, methyl ethyl ketone, methyl isobutyl ketone, and cyclohexanone, aromatic hydrocarbons, such as benzene, toluene, and xylene, and amides, such as dimethylformamide and dimethylacetamide.

Laminate

The laminate of the present invention is obtained by lamination and molding using the above-described prepreg. Specifically, the laminate of the present invention is manufactured by lamination and molding in a configuration in which one or a plurality of the above-described prepregs are stacked, and metal foil, such as copper or aluminum, is disposed on one surface or both surfaces of the stack as desired. The metal foil used is not particularly limited as long as it is one used for a printed wiring board material. As the molding conditions, usual methods for laminates and multilayer boards for printed wiring boards can be applied. For example, a multistage press, a multistage vacuum press, continuous molding, an autoclave molding machine, or the like is used, and generally, the temperature is in the range of 100 to 300° C., the pressure is in the range of 2 to 100 kgf/cm$^2$, and the heating time is in the range of 0.05 to 5 hours. In addition, a multilayer board can also be provided by combining the prepreg of the present invention with a separately fabricated wiring board for an inner layer, and laminating and molding the combination. The present invention will be described in detail below by giving Synthesis Examples, Examples, and Comparative Examples.

EXAMPLES

Synthesis Example 1

Synthesis of α-Naphthol Aralkyl-Based Cyanate Ester Compound

A reactor to which a thermometer, a stirrer, a dropping funnel, and a reflux condenser were attached was previously cooled to 0 to 5° C. by brine, and was charged with 7.47 g (0.122 mol) of cyanogen chloride, 9.75 g (0.0935 mol) of 35% hydrochloric acid, 76 ml of water, and 44 ml of methylene chloride. While the temperature in this reactor was maintained at −5 to +5° C. and pH was maintained 1 or less, a solution in which 20 g (0.0935 mol) of α-naphthol aralkyl (the above formula (6), wherein all R is a hydrogen atom, SN485, hydroxyl group equivalent: 214 g/eq., softening point: 86° C., manufactured by Nippon Steel Chemical Co., Ltd.) and 14.16 g (0.14 mol) of triethylamine were dissolved in 92 ml of methylene chloride was dropped by the dropping funnel over 1 hour with stirring. After the completion of the dropping, 4.72 g (0.047 mol) of triethylamine was further dropped over 15 minutes.

After the completion of the dropping, the mixture was stirred at the same temperature for 15 minutes, and then, the reaction liquid was separated, and the organic layer was fractionated. The obtained organic layer was washed twice with 100 ml of water, and then, the methylene chloride was distilled off under reduced pressure by an evaporator. Finally, the organic layer was concentrated to dryness at 80° C. for 1 hour to obtain 23.5 g of an α-naphthol aralkyl-based cyanate ester compound.

The obtained cyanate ester compound was analyzed by liquid chromatography and an IR spectrum. No raw material peak was detected. In addition, the structure was identified by $^{13}$C-NMR and $^1$H-NMR. The conversion rate from a hydroxyl group to a cyanate group was 99% or more.

Synthesis Example 2

Synthesis of BT Resin (BT2610)

40 Parts by mass of 2,2-bis(4-cyanatophenyl)propane (CX, manufactured by Mitsubishi Gas Chemical Company, Inc.) and 60 parts by mass of bis(3-ethyl-5-methyl-4-maleimidediphenyl)methane (BMI-70, manufactured by K.I Chemical Industry Co., Ltd.) were melted at 150° C., and reacted with stirring until the mixed resin reached 1.2 Pa·s as measured by a cone-plate viscometer. Then, the mixed resin was dissolved in methyl ethyl ketone to obtain a BT resin.

Example 1

45 Parts by mass of a naphthol aralkyl-based phenolic resin (SN-495, manufactured by Nippon Steel Chemical Co., Ltd., hydroxyl group equivalent: 236 g/eq.), 55 parts by mass of a phenol biphenyl aralkyl-based epoxy resin (NC-3000-FH, epoxy equivalent: 320 g/eq., manufactured by Nippon Kayaku Co., Ltd.), 150 parts by mass of boehmite (APYRAL AOH60, manufactured by Nabaltec AG) (Mohs hardness 3.5), 5 parts by mass of a wetting and dispersing agent (BYK-W903, manufactured by BYK Japan KK), 10 parts by mass of zinc molybdate (manufactured by NIPPON INORGANIC COLOUR & CHEMICAL CO., LTD.), and 0.03 parts by mass of imidazole (2E4MZ, manufactured by SHIKOKU CHEMICALS CORPORATION) were mixed to obtain a varnish. This varnish was diluted with methyl ethyl ketone, and an E-glass woven fabric having a thickness of 0.1 mm was impregnated and coated with the diluted varnish, and heated and dried at 160° C. for 4 minutes to obtain a prepreg having a resin content of 50% by weight.

Making of Metal Foil-Clad Laminate

Four of the obtained prepregs were stacked, and 12 μm thick electrolytic copper foil (3EC-III, manufactured by Mitsui Mining & Smelting Co., Ltd.) was disposed on the top and the bottom. The stack was laminated and molded at a pressure of 30 kgf/cm$^2$ and a temperature of 220° C. for 120 minutes to obtain a metal foil-clad laminate having an insulating layer thickness of 0.4 mm.

Example 2

Operation was performed as in Example 1 except that the amount of zinc molybdate (manufactured by NIPPON INORGANIC COLOUR & CHEMICAL CO., LTD.) was decreased to 1 part by mass.

Example 3

Operation was performed as in Example 1 except that 10 parts by mass of molybdic acid (manufactured by NIPPON INORGANIC COLOUR & CHEMICAL CO., LTD.) was used instead of 10 parts by mass of zinc molybdate (manufactured by NIPPON INORGANIC COLOUR & CHEMICAL CO., LTD.).

Example 4

Operation was performed as in Example 1 except that 10 parts by mass of molybdenum trioxide (manufactured by NIPPON INORGANIC COLOUR & CHEMICAL CO., LTD.) was used instead of 10 parts by mass of zinc molybdate (manufactured by NIPPON INORGANIC COLOUR & CHEMICAL CO., LTD.).

Example 5

Operation was performed as in Example 1 except that 10 parts by mass of TF-2000 (ammonium molybdate, manufactured by NIPPON INORGANIC COLOUR & CHEMICAL CO., LTD.) was used instead of 10 parts by mass of zinc molybdate (manufactured by NIPPON INORGANIC COLOUR & CHEMICAL CO., LTD.).

Example 6

Operation was performed as in Example 1 except that 45 parts by mass of the α-naphthol aralkyl-based cyanate ester compound (cyanate equivalent: 261 g/eq.) made in Synthesis Example 1 was used instead of 45 parts by mass of a naphthol aralkyl-based phenolic resin (SN-495, manufactured by Nippon Steel Chemical Co., Ltd., hydroxyl group equivalent: 236 g/eq.), and 0.01 parts by mass of zinc octylate was used instead of 0.03 parts by mass of imidazole (2E4MZ, manufactured by SHIKOKU CHEMICALS CORPORATION).

Example 7

Operation was performed as in Example 1 except that 55 parts by mass of a polyoxynaphthylene-based epoxy resin (EXA-7311, epoxy equivalent: 277 g/eq.) was used instead of 55 parts by mass of a phenol biphenyl aralkyl-based epoxy resin (NC-3000-FH, epoxy equivalent: 320 g/eq., manufactured by Nippon Kayaku Co., Ltd.).

Example 8

Operation was performed as in Example 1 except that 150 parts by mass of spherical silica (SFP-130MC) (Mohs hardness 7) was used instead of 150 parts by mass of boehmite (APYRAL AOH60, manufactured by Nabaltec AG) (Mohs hardness 3.5), and 5 parts by mass of a wetting and dispersing agent (Disperbyk 161, manufactured by BYK Japan KK) was used instead of 5 parts by mass of a wetting and dispersing agent (BYK-W903, manufactured by BYK Japan KK).

Example 9

Operation was performed as in Example 1 except that 150 parts by mass of magnesium carbonate (Ultracarb 1200, manufactured by Minelco) (Mohs hardness 3.5) was used instead of 150 parts by mass of boehmite (APYRAL AOH60, manufactured by Nabaltec AG) (Mohs hardness 3.5).

Example 10

Operation was performed as in Example 1 except that 600 parts by mass of alumina (manufactured by Nippon Steel Materials Co., Ltd. Micron Co.) (Mohs hardness 9) was used instead of 150 parts by mass of boehmite (APYRAL AOH60, manufactured by Nabaltec AG) (Mohs hardness 3.5).

Example 11

Operation was performed as in Example 1 except that in Example 1, the amount of the naphthol aralkyl-based phenolic resin (SN-495, manufactured by Nippon Steel Chemical Co., Ltd., hydroxyl group equivalent: 236 g/eq.) was decreased by 5 parts by mass, and the amount of the phenol biphenyl aralkyl-based epoxy resin (NC-3000-FH, epoxy equivalent: 320 g/eq., manufactured by Nippon Kayaku Co., Ltd.) was decreased by 10 parts by mass, and instead, 15 parts by mass of bis(3-ethyl-5-methyl-4-maleimidediphenyl)methane (BMI-70, manufactured by K.I Chemical Industry Co., Ltd.) was used.

Example 12

Operation was performed as in Example 1 except that in Example 1, 10 parts by mass of a silicone powder (KMP-605, manufactured by Shin-Etsu Chemical Co., Ltd.) was added.

Example 13

Operation was performed as in Example 1 except that the amount of boehmite (APYRAL AOH60, manufactured by Nabaltec AG) (Mohs hardness 3.5) was decreased to 60 parts by mass.

Comparative Example 1

Operation was performed as in Example 1 except that in Example 1, the zinc molybdate (manufactured by NIPPON INORGANIC COLOUR & CHEMICAL CO., LTD.) was not added.

Comparative Example 2

Operation was performed as in Example 1 except that in Example 1, the phenol biphenyl aralkyl-based epoxy resin (NC-3000-FH, epoxy equivalent: 320 g/eq., manufactured by Nippon Kayaku Co., Ltd.) was not added. However, curing did not occur.

Comparative Example 3

Operation was performed as in Example 1 except that in Example 1, the naphthol aralkyl-based phenolic resin (SN-495, manufactured by Nippon Steel Chemical Co., Ltd., hydroxyl group equivalent: 236 g/eq.) was not added. However, curing did not occur.

Comparative Example 4

Operation was performed as in Example 1 except that in Example 1, boehmite (APYRAL AOH60, manufactured by Nabaltec AG) (Mohs hardness 3.5) was not added.

Comparative Example 5

Operation was performed as in Example 1 except that 150 parts by mass of magnesium hydroxide (KISUMA 8SN, manufactured by Kyowa Chemical Industry Co., Ltd.) (Mohs hardness 2.5) was used instead of 150 parts by mass of boehmite (APYRAL AOH60, manufactured by Nabaltec AG) (Mohs hardness 3.5), and the zinc molybdate (manufactured by NIPPON INORGANIC COLOUR & CHEMICAL CO., LTD.) was not added.

Comparative Example 6

Operation was performed as in Example 1 except that 150 parts by mass of magnesium hydroxide (KISUMA 8SN, manufactured by Kyowa Chemical Industry Co., Ltd.) (Mohs hardness 2.5) was used instead of 150 parts by mass of boehmite (APYRAL AOH60, manufactured by Nabaltec AG) (Mohs hardness 3.5).

Comparative Example 7

Operation was performed as in Example 1 except that 150 parts by mass of aluminum hydroxide (CL-303, manufactured by Sumitomo Chemical Co., Ltd.) (Mohs hardness 3) was used instead of 150 parts by mass of boehmite (APYRAL AOH60, manufactured by Nabaltec AG) (Mohs hardness 3.5).

Comparative Example 8

Operation was performed as in Example 10 except that in Example 10, 600 parts by mass of alumina (manufactured by Nippon Steel Materials Co., Ltd. Micron Co.) (Mohs hardness 9) was increased to 800 parts by mass.

Comparative Example 9

Operation was performed as in Example 1 except that in Example 1, 150 parts by mass of boehmite (APYRAL AOH60, manufactured by Nabaltec AG) (Mohs hardness 3.5) was decreased to 30 parts by mass.

Using the obtained metal foil-clad laminates, flame retardancy, heat resistance, thermal expansion coefficient, and drillability were evaluated.

The flame retardancy and the thermal expansion coefficient were performed by the following methods after the metal foil-clad laminate was etched to remove the copper foil.

Flame retardancy: Using the etched laminate having a plate thickness of 0.8 mm, the flame retardancy was evaluated according to the UL94 vertical burning test method.

Thermal expansion coefficient: The temperature was increased by 10° C. per minute from 40° C. to 340° C. by a thermomechanical analyzer (manufactured by TA Instruments), and the linear expansion coefficient in the planar direction at 60° C. to 120° C. was measured. The measurement direction was the longitudinal direction (Warp) of the glass cloth of the laminate.

The heat resistance evaluation was performed by the following method for the metal foil-clad laminate.

Heat resistance: A 50×50 mm sample was floated in 300° C. solder for 30 minutes, and the time until delamination occurred was measured. A case where no delamination occurred even when 30 minutes elapsed, was represented as >30 min in the table.

For the drillability evaluation, accuracy of hole position was evaluated under the following drilling conditions.

Processing machine: ND-1 V212 manufactured by Hitachi Via Mechanics, Ltd.
Number of stacked plates: four metal foil-clad laminates
Entry sheet: LE450 manufactured by Mitsubishi Gas Chemical Company, Inc.
Backup board: PS-1160D manufactured by RISHO KOGYO CO., LTD.
Drill bit: MD MC 0.18×3.3 L508A manufactured by UNION TOOL CO.)
Number of revolutions: 160 krpm
Feed speed: 0.8 m/min
Number of hits: 3000

The evaluation results are shown in Table 1 and Table 2.

TABLE 1

| | Example 1 | Example 2 | Example 3 | Example 4 | Example 5 | Example 6 | Example 7 | Example 8 | Example 9 | Example 10 | Example 11 | Example 12 | Example 13 |
|---|---|---|---|---|---|---|---|---|---|---|---|---|---|
| Accuracy of hole position | 0.020 | 0.025 | 0.020 | 0.020 | 0.020 | 0.020 | 0.022 | 0.020 | 0.020 | 0.030 | 0.020 | 0.018 | 0.018 |
| Thermal expansion coefficient | 11.0 | 11.0 | 11.0 | 11.0 | 11.0 | 11.0 | 10.5 | 10.5 | 10.5 | 10.0 | 11.0 | 10.5 | 120 |
| Heat resistance | >30 min | >30 min | >30 min | >30 min | >30 min | >30 min | >30 min | >30 min | >30 min | >30 min | >30 min | >30 min | >30 min |

TABLE 1-continued

| | Example 1 | Example 2 | Example 3 | Example 4 | Example 5 | Example 6 | Example 7 | Example 8 | Example 9 | Example 10 | Example 11 | Example 12 | Example 13 |
|---|---|---|---|---|---|---|---|---|---|---|---|---|---|
| Flame retardancy | V-0 | V-0 | V-0 | V-0 | V-0 | V-0 | V-0 | V-0 | V-0 | V-0 | V-0 | V-0 | V-0 |

Unit Thermal expansion coefficient: ppm/° C. Accuracy of hole position: mm

TABLE 2

| | Comparative Example 1 | Comparative Example 2 | Comparative Example 3 | Comparative Example 4 | Comparative Example 5 | Comparative Example 6 | Comparative Example 7 | Comparative Example 8 | Comparative Example 9 |
|---|---|---|---|---|---|---|---|---|---|
| Accuracy of hole position | 0.040 | No curing | No curing | 0.020 | 0.040 | 0.020 | 0.020 | 0.040 | 0.020 |
| Thermal expansion coefficient | 11.0 | | | 15.0 | 13.0 | 13.0 | 13.0 | 10.0 | 14.5 |
| Heat resistance | >30 min | | | >30 min | 20 min | 20 min | 1 min | >30 min | >30 min |
| Flame retardancy | V-0 | | | Complete burning | V-0 | V-0 | V-0 | V-0 | Complete burning |

Unit Thermal expansion coefficient: ppm/° C. Accuracy of hole position : mm

Comparative Example 1 was inferior in accuracy of hole position to Example 1. Comparative Example 2 was not cured. Comparative Example 3 was not cured. Comparative Example 4 was inferior in thermal expansion coefficient and flame retardancy to Example 1. Comparative Example 5 was inferior in accuracy of hole position, thermal expansion coefficient, and heat resistance to Example 1. Comparative Example 6 was inferior in thermal expansion coefficient and heat resistance to Example 1. Comparative Example 7 was inferior in thermal expansion coefficient and heat resistance to Example 1. Comparative Example 8 was inferior in accuracy of hole position to Example 10. Comparative Example 9 was inferior in thermal expansion coefficient and flame retardancy to Example 1.

From the above, it has been confirmed that the laminate using the prepreg obtained according to the present invention has high heat resistance, a small thermal expansion coefficient, and excellent drillability, and can maintain a high degree of flame retardancy without using a halogen-based flame retardant and a phosphorus compound as flame retardants.

The invention claimed is:

1. A resin composition comprising:
a molybdenum compound (A);
an epoxy resin (B), the epoxy resin being a phenol biphenyl aralkyl-based epoxy represented by the following formula (2):

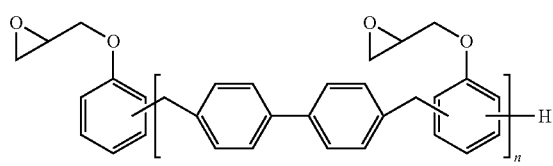

(2)

wherein n represents an integer of 1 or more;
a phenolic resin as a curing agent (C), the phenolic resin being represented by the following formula (9):

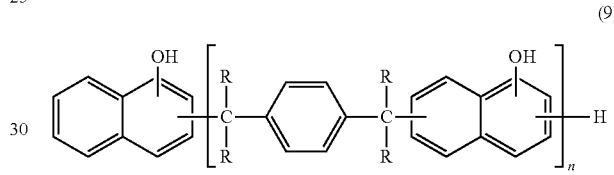

(9)

wherein R represents a hydrogen atom or a methyl group, and n represents an integer of 1 or more; and
an inorganic filler (D) comprising at least one selected from the group consisting of boehmite, calcium carbonate, magnesium carbonate, aluminum nitride, silica, burnt talc, and alumina, wherein
a Mohs hardness of the inorganic filler (D) is 3.5 or more, and a content of the inorganic filler (D) is 80 to 250 parts by mass based on 100 parts by mass of a total of resin solid components.

2. The resin composition according to claim 1, wherein the molybdenum compound (A) is at least one selected from the group consisting of zinc molybdate, molybdic acid, molybdenum trioxide, and ammonium molybdate, and a content of the molybdenum compound (A) is 0.2 to 30 parts by mass based on 100 parts by mass of the total of the resin solid components.

3. The resin composition according to claim 1, wherein the resin composition is for manufacturing a prepreg for a printed wiring board.

4. The resin composition according to claim 1, further comprising a maleimide compound and/or a bismaleimide-triazine resin.

5. The resin composition according to claim 1, wherein an amount of the epoxy resin (B) blended is 5 to 60 parts by mass based on 100 parts by mass of a total of the epoxy resin (B) and the curing agent (C).

6. The resin composition according to claim 1, wherein a content of an inorganic filler having a Mohs hardness of less than 3.5 is 100 parts by mass or less based on 100 parts by mass of the molybdenum compound (A).

7. A prepreg obtained by impregnating or coating a substrate with the resin composition according to claim 1.

8. A laminate obtained by laminating and molding the prepreg according to claim 7.

9. A metal foil-clad laminate obtained by laminating and molding the prepreg according to claim 7 and a metal foil.

10. The resin composition according to claim 1, wherein the molybdenum compound (A) is in unsupported form.

11. The resin composition according to claim 1, wherein the inorganic filler (D) has an average particle diameter (D50) of 0.2 to 5 μm.

12. The resin composition according to claim 1, wherein the inorganic filler (D) comprises silica.

\* \* \* \* \*